Jan. 29, 1963

W. SHOCKLEY 3,076,170

ELECTRICAL COMPONENT HOLDER

Filed March 17, 1960

2 Sheets-Sheet 1

WILLIAM SHOCKLEY
*INVENTOR.*

BY Flehr & Swain
ATTORNEYS

Jan. 29, 1963 W. SHOCKLEY 3,076,170

ELECTRICAL COMPONENT HOLDER

Filed March 17, 1960

2 Sheets-Sheet 2

WILLIAM SHOCKLEY
*INVENTOR.*

BY Flehr & Swain
ATTORNEYS

United States Patent Office 3,076,170

Patented Jan. 29, 1963

3,076,170

ELECTRICAL COMPONENT HOLDER

William Shockley, Los Altos, Calif., assignor to Shockley Transistor Corporation, a corporation of California Filed Mar. 17, 1960, Ser. No. 15,756
1 Claim. (Cl. 339—217)

This invention relates generally to electrical component holders and more particularly to a component holder for reducing the time spent in constructing a breadboard of an electrical circuit.

In breadboarding a circuit, an appreciable amount of the circuit designer's time is spent soldering and unsoldering components. The designer may spend considerable time calculating and thinking up a change before assembling the circuit since he is reluctant to try small circuit variations because it may take considerable time to disassemble and reassemble the circuit incorporating the change.

Any reduction in the time spent in assembly and disassembly will increase the productivity of the designer, thus reducing the ultimate cost of the circuit and making the designer available for other design tasks.

It is a general object of the present invention to provide a component holder which eliminates tedious and time consuming soldering operations in wiring breadboard circuits.

It is another object of the present invention to provide a component holder which is adapted to form a solderless connection with one or more terminal leads which are inserted therein.

It is another object of the present invention to provide a component holder which includes a plurality of resilient, closely spaced members adapted to receive a terminal lead of replaceable components to retain the same and form competent electrical contact therewith.

It is still another object of the present invention to provide a component holder which is adapted to form a solderless connection with one or more terminal leads which are inserted therein and which includes means for replaceably inserting the component holder in a supporting base.

It is still another object of the present invention to provide a component holder which is adapted to form a solderless connection with one or more terminal leads which are presented thereto and which includes means for readily making electrical connection thereto as, for example, for testing and measuring purposes.

These and other objects of the invention will become more clearly apparent from the following description when taken in conjunction with the accompanying drawings.

Referring to the drawings.

Figure 3:
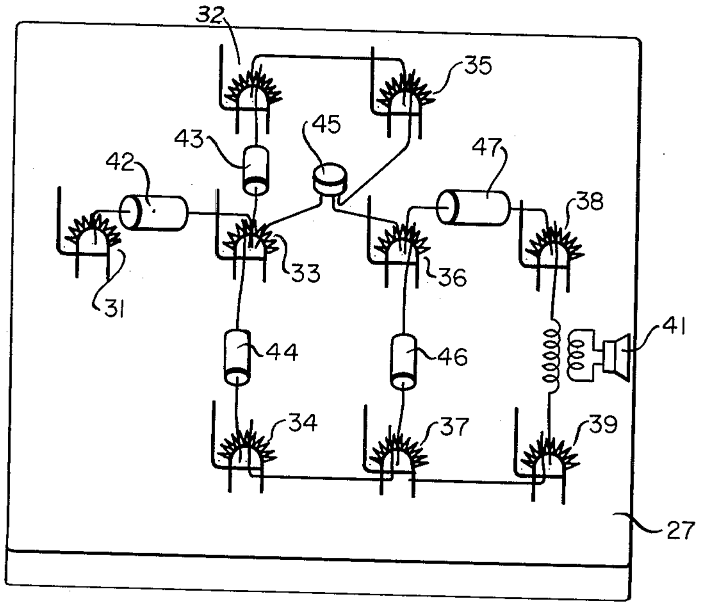
Figure 4:
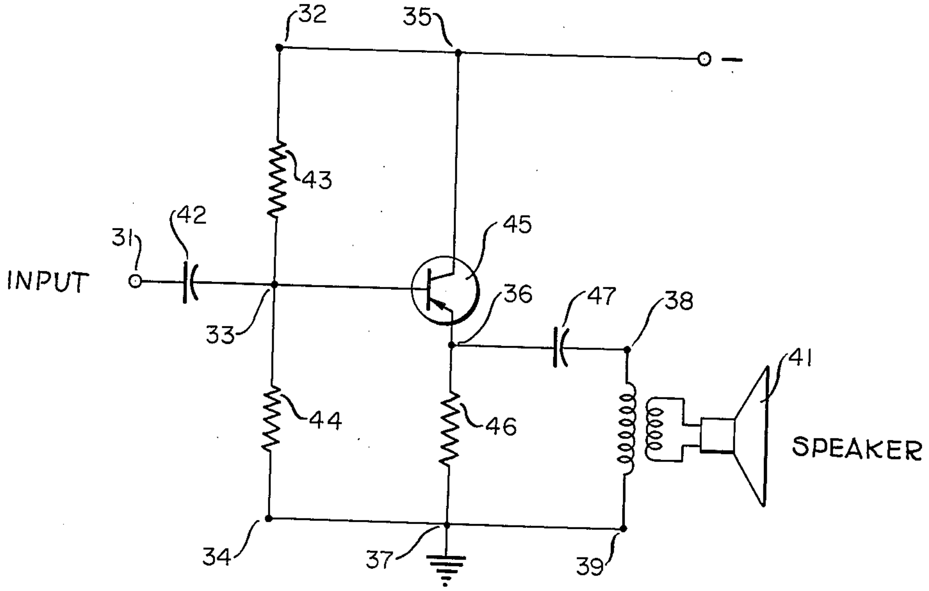

FIGURE 3 schematically illustrates a breadboarded emitter follower output stage; and FIGURE 4 is a schematic circuit diagram of the breadboard circuit of FIGURE 7.

Figures 1, 2, 9:
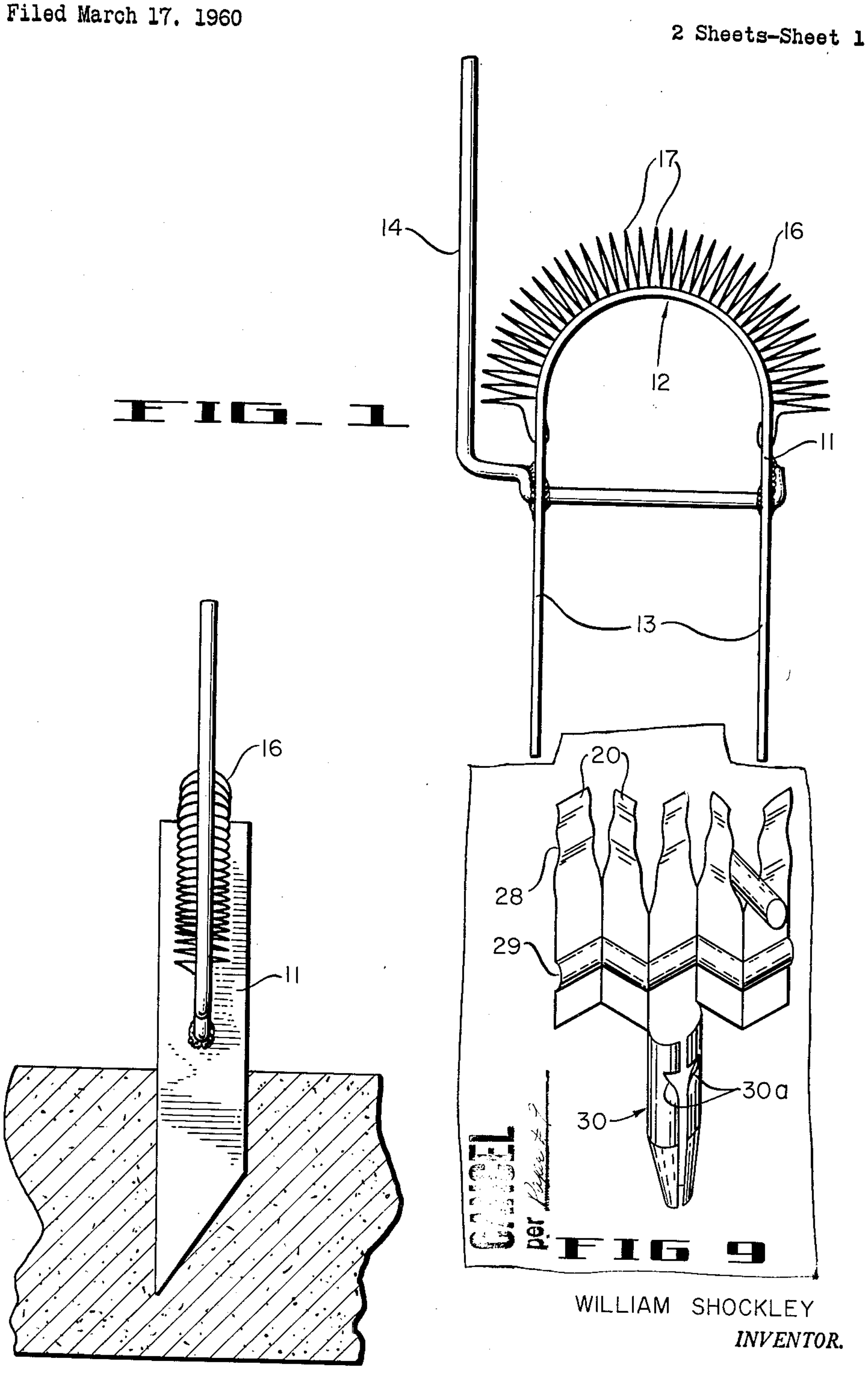
FIGURE 1 is a side elevational view of a component holder incorporating the present invention.
FIGURE 2 is a side elevational view of the component holder shown in FIGURE 1.

The embodiment of the invention shown in FIGURES 1 and 2 includes a U-shaped band 11 having a convex top 12 and spaced depending legs or prongs 13. Preferably, means are provided for conveniently making electrical connection to the band. For this purpose, a rod or wire 14 may be electrically connected to the band as, for example, by soldering or brazing.

A coiled spring 16 including helically wound filamentary material forming a plurality of adjacent convolutions is fastened over the convex top. Adjacent convolutions form spaced members 17 adapted to receive and make solderless electrical connection to leads inserted between the same. The adjacent convolutions which form contacting members are spaced a distance less than the diameter of the lead to be inserted therein whereby they are moved outwardly when a lead is inserted. The resilient members then frictionally engage the lead. This holds the lead and serves also to provide a suitable pressure for forming competent electrical contact.

In use, the component holder is then placed with the prongs 13 extending into a porous material such as polystyrene foam (FIGURE 3). The component holders may be spaced as desired to form common nodes for electrical components forming the breadboard circuit. The vertical rod or wire 14 is useful for connecting voltmeters, oscilloscopes or other measuring instruments to the various nodes.

Preferably, when the component holder is employed with a supporting base such as polystyrene board, foam board, it is desirable to so select the shape and configura- between adjacent convolutions without pulling the com- tion of the prongs that the component can be pulled out ponent holder from the supporting base. This may be accomplished, for example, by forming the prongs so that they have substantial surface area whereby the frictional forces between the base and the prongs is greater than the frictional forces retaining the terminal leads. Alternately, the prongs may be formed to have barbs or roughened surfaces whereby they serve to engage the base.

Thus, there is provided a component holder which includes a plurality of adjacent resilient members for forming electrical contact with leads applied thereto and for frictionally retaining the same. The holder includes means for securing the same to a supporting insulating base. It may also include means for making connection to the various nodes.

Referring to FIGURE 3, there is illustrated a breadboard circuit employing component holders in accordance with the invention. The various component holders are inserted into the polystyrene foam board 27 spaced to receive the terminal leads of the components. The holders are numbered 31, 32, 33, 34, 35, 36, 37, 38 and 39. To form a circuit of the type shown in FIGURE 4 which is an emitter follower output stage for driving a speaker 41, the various components are suitably inserted between the upstanding resilient members and frictionally engaged thereby. Thus, the capacitor has its leads connected with the holders 31 and 33; the resistor 43 is connected with the holders 32 and 33; and resistor 44, between holders 33 and 34. There is a common bus between the holders 32 and 35. A transistor 45 has its base connected to the holder 33, its collector to holder 35, and its emitter to holder 36. A resistor 46 is connected between the holders 36 and 37, and a capacitor 47 is connected between the holders 36 and 38. The primary windings of the speaker transformer are connected between the holders 38 and 39.

It is seen from the foregoing example that the various elements can be rapidly inserted into the holders with a plurality of leads being received by the individual holders as, for example, the holders 33 and 37.

It will be apparent to one skilled in the art that the various component holders may be so designated as to fit into modular spaced holes formed in an insulating board or a printed circuit board.

It is apparent that the invention provides a means whereby the wiring of breadboard circuits is simplified. A circuit designer may rapidly set up a circuit for test purposes and can then make modification rapidly.

It is also apparent that the same principles may be employed in permanent circuits by solder dipping or otherwise soldering the temporary connections.

I claim:

A component holder for retaining and making electrical contact with leads applied thereto comprising a U-shaped member having a convex portion and downwardly extending spaced support members, a coil of helically wound resilient material disposed over the convex portion of said U-shaped member, said U-shaped member being disposed entirely outside of said coil of helically wound resilient material, said coil forming a plurality of adjacent resilient members adapted to receive and frictionally engage with a wedging action leads applied to and including portions spaced less than the diameter of the leads whereby the adjacent convolutions are urged apart by the lead as it is inserted therein, and a supporting base adapted to receive said downwardly extending spaced support members.

References Cited in the file of this patent

UNITED STATES PATENTS

| | | |
|---|---|---|
| 806,691 | Merten | Dec. 5, 1905 |
| 1,466,351 | Brocket et al. | Aug. 28, 1923 |
| 2,459,390 | Olson | Jan. 18, 1949 |
| 2,553,287 | Yates | May 15, 1951 |
| 2,732,534 | Giel | Jan. 24, 1956 |

OTHER REFERENCES

Electronic Design, January 1, 1957, page 49.

UNITED STATES PATENT OFFICE
CERTIFICATE OF CORRECTION

Patent No. 3,076,170 January 29, 1963

William Shockley

It is hereby certified that error appears in the above numbered patent requiring correction and that the said Letters Patent should read as corrected below.

Column 2, lines 21 and 22, strike out "between adjacent convolutions without pulling the comtion of the prongs that the component can be pulled out" and insert instead -- tion of the prongs that the component can be pulled out between adjacent convolutions without pulling the com- --.

Signed and sealed this 3rd day of September 1963.

(SEAL)
Attest:

ERNEST W. SWIDER
Attesting Officer

DAVID L. LADD
Commissioner of Patents